US010008257B2

(12) United States Patent
Kwack et al.

(10) Patent No.: US 10,008,257 B2
(45) Date of Patent: Jun. 26, 2018

(54) MEMORY BITCELL WITH COLUMN SELECT

(71) Applicant: ORACLE INTERNATIONAL CORPORATION, Redwood City, CA (US)

(72) Inventors: Jinho Kwack, Santa Clara, CA (US); Hoyeol Cho, Palo Alto, CA (US); Heechoul Park, San Jose, CA (US); Myung Gyoo Won, Santa Clara, CA (US); Peter Labrecque, Austin, TX (US); Jungyong Lee, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days. days.

(21) Appl. No.: 14/948,028

(22) Filed: Nov. 20, 2015

(65) Prior Publication Data
US 2017/0148506 A1    May 25, 2017

(51) Int. Cl.
*G11C 11/412*    (2006.01)
*G11C 11/418*    (2006.01)
(Continued)

(52) U.S. Cl.
CPC .......... *G11C 11/419* (2013.01); *G11C 11/418* (2013.01); *G11C 7/18* (2013.01); *G11C 11/412* (2013.01)

(58) Field of Classification Search
CPC .............................. G11C 11/417; G11C 11/418
(Continued)

(56) References Cited

U.S. PATENT DOCUMENTS 5,828,597 A * 10/1998 Madan .................. G11C 11/412
                                                      365/156
6,104,234 A *  8/2000 Shin ........................ G05F 3/205
                                                      327/534
(Continued)

OTHER PUBLICATIONS

M. Yabuuchi, et al. "A 45nm 0.6V Cross-Point 8T SRAM with Negative Biased Read/Write Assist" Symposium on VLSI Circuits Digest of Technical Press. 2009.

*Primary Examiner* — Amir Zarabian
*Assistant Examiner* — Jay Radke
(74) *Attorney, Agent, or Firm* — Marsh Fischmann & Breyfogle LLP; Jonathon A. Szumny

(57) ABSTRACT

Embodiments include systems and methods for improving column selection functionality of memory circuits. Embodiments operate in context of memory bitcells having additional series pass gates (e.g., junction sharing transistors) coupled with a column select signal to form an integrated column select port. Such a column select port can provide each bitcell with column select functionality in a manner that has improved area and power performance over some conventional (added NOR or other logic) approaches. However, the added column select port can still tend to add area, add column select load, and degrade writability (e.g., due to certain charge-sharing effects). Some embodiments are described herein for addressing the area and column select load by sharing certain intermediate nodes among multiple, adjacent bitcells. Other embodiments can include additional ground-connected transistors in a manner that improves writability (e.g., and read noise margin) of the bitcell.

10 Claims, 10 Drawing Sheets

(51) Int. Cl.
*G11C 11/419* (2006.01)
*G11C 7/18* (2006.01)

(58) Field of Classification Search
USPC .................................. 365/154, 156, 230.06
See application file for complete search history.

(56) References Cited

U.S. PATENT DOCUMENTS

| | | | |
|---|---|---|---|
| 6,285,580 B1* | 9/2001 | Phan | G11C 11/4125 |
| | | | 365/154 |
| 6,661,733 B1* | 12/2003 | Pan | H03K 19/1776 |
| | | | 365/154 |
| 7,164,596 B1* | 1/2007 | Deng | G11C 11/417 |
| | | | 365/154 |
| 9,013,950 B2 | 4/2015 | Cha | |
| 9,058,866 B2 | 6/2015 | Freiburger | |
| 2003/0090929 A1* | 5/2003 | Nii | G11C 11/412 |
| | | | 365/156 |
| 2006/0098474 A1* | 5/2006 | Dang | G11C 7/12 |
| | | | 365/154 |
| 2007/0139996 A1* | 6/2007 | Ozawa | G11C 11/412 |
| | | | 365/154 |
| 2007/0274140 A1* | 11/2007 | Joshi | G11C 7/02 |
| | | | 365/189.11 |
| 2010/0091590 A1* | 4/2010 | Takeda | G11C 7/02 |
| | | | 365/191 |
| 2010/0302831 A1* | 12/2010 | Takeyama | G11C 11/412 |
| | | | 365/72 |
| 2015/0294714 A1* | 10/2015 | Pickering | G11C 11/419 |
| | | | 365/154 |
| 2015/0371708 A1* | 12/2015 | Pickering | G11C 8/14 |
| | | | 711/105 |

* cited by examiner

MEMORY BITCELL WITH COLUMN SELECT

FIELD

Embodiments relate generally to memory circuits, and, more particularly, to dual-port memory bitcell circuits having enhanced column select functionality.

BACKGROUND

Typical memory circuits, such as static random access memory (SRAM) circuits, include a number of bitcells that can be written to and read from. Typically, the bitcells are arranged in an array, and individual bitcells can be addressed (for reading or writing) by selecting a corresponding column and row at which the bitcell is located in the array. Conventional bitcell designs typically include integrated row selection ports, but column selection is typically performed using circuitry external to the bitcell. For example, a NOR gate, or other suitable logic, can be added for column selection. Such approaches can have certain limitations, such as increasing area and power consumption of the memory circuit.

BRIEF SUMMARY

Among other things, systems and methods are described for improving column selection functionality of memory circuits. Embodiments operate in context of memory bitcells having additional series pass gates (e.g., junction sharing transistors) coupled with a column select signal to form an integrated column select port. Such a column select port can provide each bitcell with column select functionality in a manner that has improved area and power performance over conventional (added NOR or other logic) approaches. However, the added column select port can still tend to add area, add column select load, and degrade writability (e.g., due to certain charge-sharing effects). Some embodiments are described herein for addressing the area and column select load by sharing certain intermediate nodes among multiple, adjacent bitcells. Other embodiments can include additional ground-connected transistors in a manner that improves writability (e.g., and read noise margin) of the bitcell.

According to one set of embodiments, a memory circuit is provided. The memory circuit includes a first series pass circuit coupled with a column select line to form a first shared column select port, the first series pass circuit coupled with a first column select node of a first memory bitcell and with a first column select node of a second memory bitcell; and a second series pass circuit coupled with the column select line to form a second shared column select port, the second series pass circuit coupled with a first column select node of a third memory bitcell and with a first column select node of a fourth memory bitcell.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
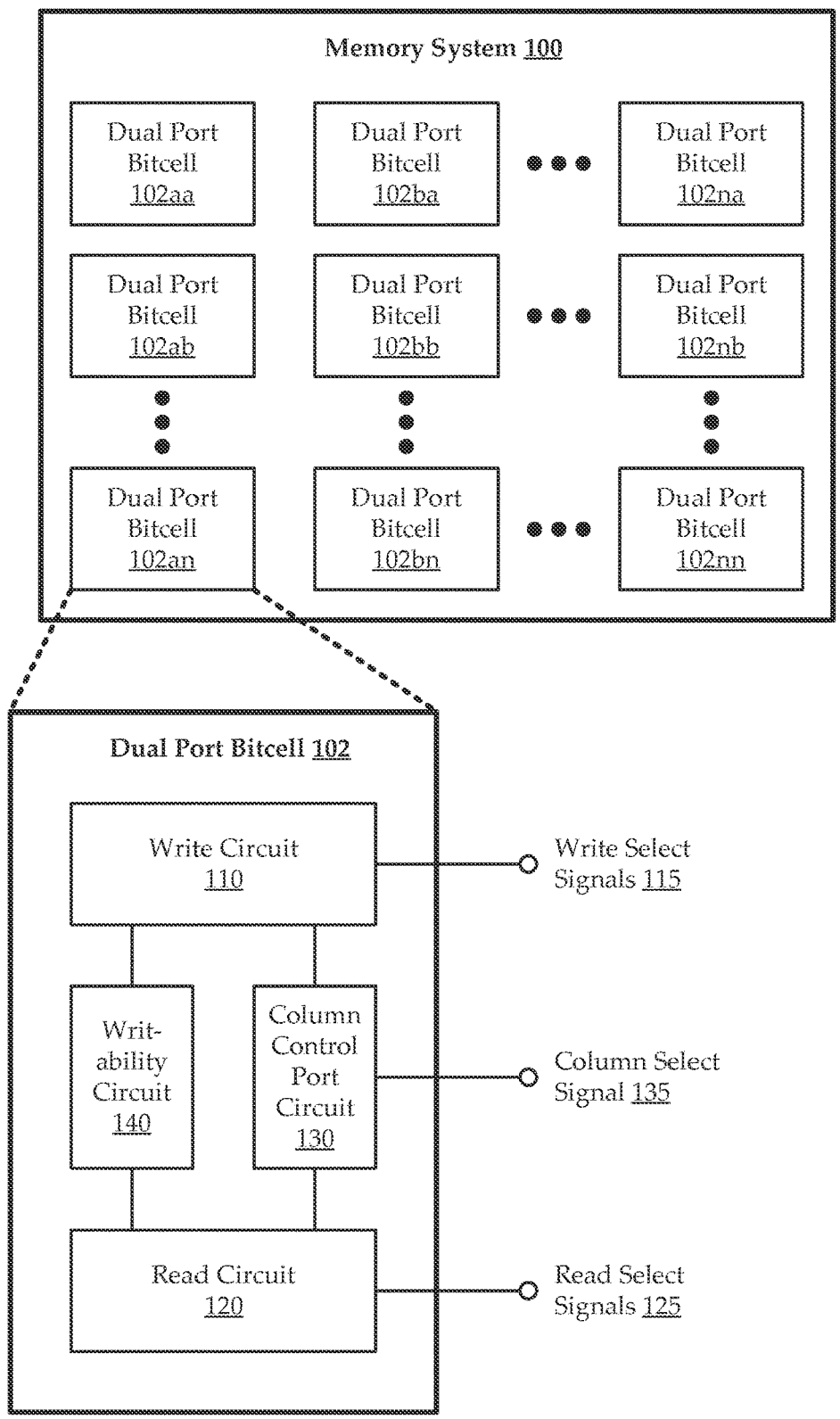
FIG. 1 shows a simplified block diagram of a memory system and an illustrative dual-port memory bitcells, according to various embodiments.

FIG. 1 shows a simplified block diagram of a memory system 100 and an illustrative dual-port memory bitcells 102, according to various embodiments. Some implementations of the memory system 100 can include semiconductor memory that uses bi-stable latching (e.g., cross-coupled inverters or the like) to store bits in bitcells 102, such as static random access memory (SRAM). The memory system includes a number of bitcells 102, which can be arranged as an array or in any other suitable manner. Embodiments of the bitcells 102 are shown as dual-port bitcells 102, such as bitcells 102 having read and write functionality. Some embodiments described herein can also be applied in context of read-only and/or write-only memory circuits.

The illustrated dual-port bitcells 102 can include a write circuit 110, a read circuit 120, a column control port circuit 130, and a writability circuit 140. The write circuit 110 can be coupled with one or more write select signals 115, such as one or more write bitlines, write wordlines, etc. The read circuit 120 can be coupled with one or more read select signals 125, such as one or more read bitlines, read wordlines, etc. The column control port circuit 130 can be coupled with one or more column select signals 135. When writing to a particular bitcell 102 in the array of the memory system 100, the particular bitcell 102 can be identified (e.g., addressed) by asserting appropriate write select signals 115 and column select signals 135. When reading from a particular bitcell 102 in the array of the memory system 100, the particular bitcell 102 can be identified (e.g., addressed) by asserting appropriate read select signals 125 and column select signals 135.

As described herein, some embodiments of the column control port circuit 130 include one or more series pass gates (e.g., junction sharing transistors) coupled with the column select signals 135 to form integrated column select ports for the bitcells 102. Such column control port circuits 130 can provide each bitcell 102 with column select functionality in a manner that has improved area and power performance over some conventional approaches. However, in some implementations, the added column control port circuit 130 can still tend to add area, add column select load, and degrade writability (e.g., due to certain charge-sharing effects). Some embodiments address the area and column select load by sharing certain intermediate nodes (i.e., sharing portions of the column control port circuits 130) among multiple, adjacent bitcells 102. Further, embodiments of the writability circuit 140 can include additional ground-connected transistors in a manner that improves writability (e.g., and read noise margin) of the bitcells 102.

Figure 2:
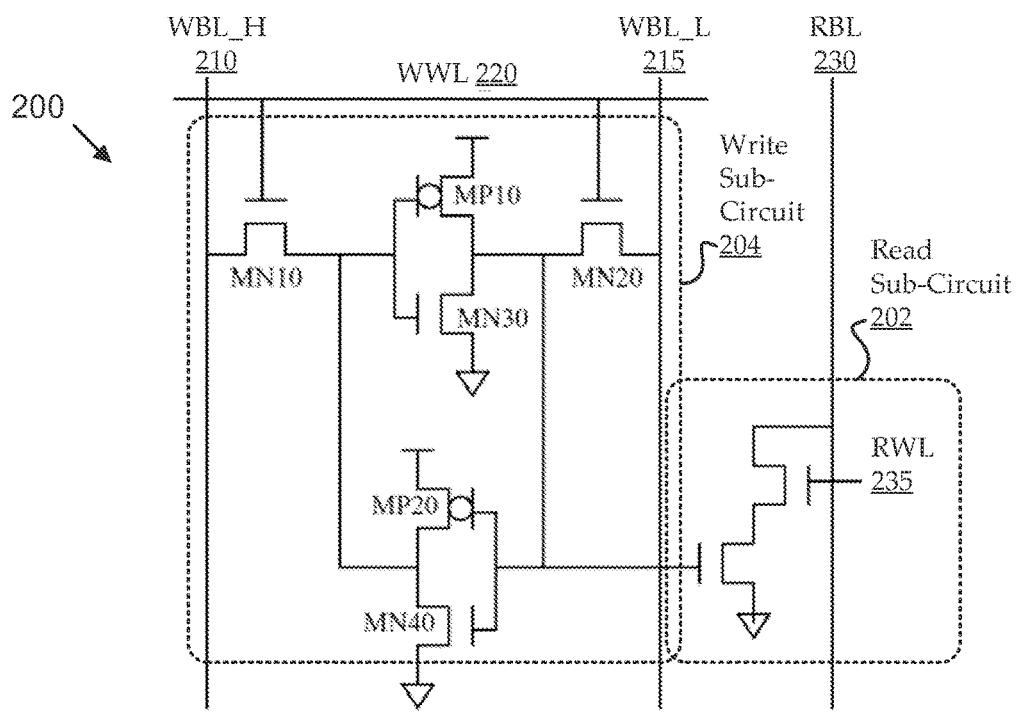
FIG. 2 shows an illustrative conventional dual-port memory bitcell circuit.

For the sake of added clarity and context, it is helpful to describe conventional memory bitcell configurations. FIG. 2 shows an illustrative conventional dual-port memory bitcell circuit 200. The conventional memory bitcell circuit 200 includes a read sub-circuit 202 and a write sub-circuit 204. While these sub-circuits are shown separately for clarity, components of each sub-circuit can contribute to functionality of the other (e.g., one or more transistors shown as part of the write sub-circuit 204 can support functionality of the read sub-circuit 202, etc.). Reading of the bitcell 200 can be controlled by selectively asserting a read bitline (RBL) 230 and/or a read wordline (RWL) 235.

The write sub-circuit 204 can include bi-stable latching (e.g., a pair of cross-coupled inverters) or any other suitable latching circuit. The latching circuit can be coupled between additional gates (e.g., two n-type metal-oxide semiconductor (NMOS) transistors), which can be coupled between two write bitlines (i.e., a high write bitline (WBL_H) 210 and a low write bitline (WBL_L) 215). The gates of the two transistors are coupled with a write wordline (WWL) 220. The two transistors, and the latching circuit (which can be implemented as a set of four transistors) are sometimes referred to as a six-transistor)("6T") core. Though not shown, conventional memory bitcell circuits 200 typically include a number of additional "dummy" transistors (e.g., six) that do not function as part of the memory circuitry, but are used to help reduce degradation of transistors at the edges of oxide diffusion columns in the physical layout. In operation, a value can be written to the bitcell 200 by applying the desired value to WBL_H. 210, applying the complement of the desired value to WBL_L 215, and asserting WWL 220. For example, if a HIGH is applied to WBL_H 210, and a LOW is applied to WBL_L 215, asserting WWL 220 causes HIGH and LOW values to be transferred (across the transistors) to respective sides of the cross-coupled inverters, which can effectively store (i.e., latch) that state when WWL 220 is de-asserted.

Figure 3:
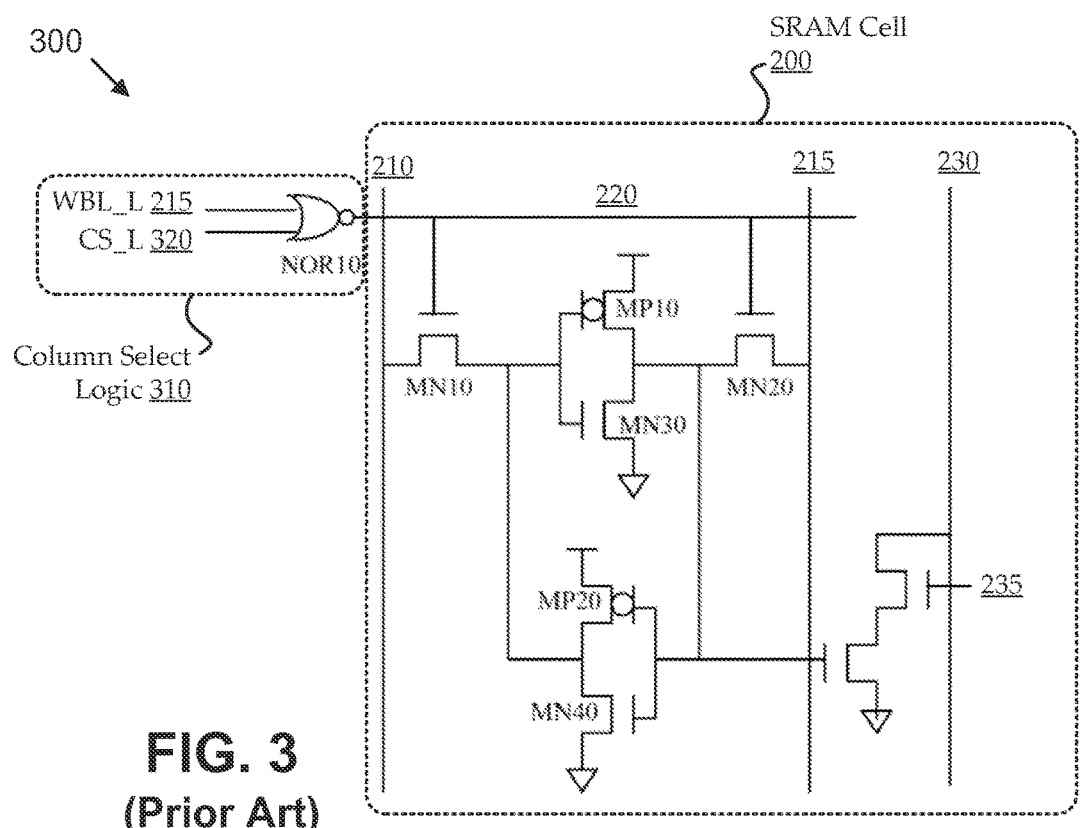
FIG. 3 shows an illustrative conventional column selection approach in context of the dual-port memory bitcell circuit of FIG. 2.

When a bitcell, such as the conventional bitcell 200 of FIG. 2, is arranged in an array of a memory system (e.g., as illustrated in FIG. 1), the above signaling can be used for row selection, and it can be desirable to further provide column selection. FIG. 3 shows an illustrative conventional column selection approach 300 in context of the dual-port memory bitcell circuit 200 of FIG. 2. As illustrated, the conventional column selection approach 300 can involve coupling column select logic 310 to the bitcell 200. In some implementations, a NOR logic gate can be used to compute a logical NOR operation of one of the write bitline signals (e.g., WBL_L 215) and a column select signal (e.g., column select low (CS_L) 320). For example, the illustrated bitcell 200 would be selected only when both inputs to the NOR gate are LOW; when WBL_L 215 is LOW (i.e., write bitline is asserted, such that WBL_H 210 is HIGH) and CS_L 320 is LOW (i.e., column selection is asserted, such that the complementary signal is LOW).

While adding column select logic 310 can be effective, it can also manifest undesirable features. One such feature is that, in some conventional implementations, adding column select logic 310 can approximately double the area of the conventional bitcell 200. For example, a typical conventional SRAM bitcell 200 alone (e.g., as shown in FIG. 2) can be approximately 0.237 $\mu m^2$, while the same bitcell 200 with added column select logic 310 can be approximately 0.528 $\mu m^2$.

Figure 5:
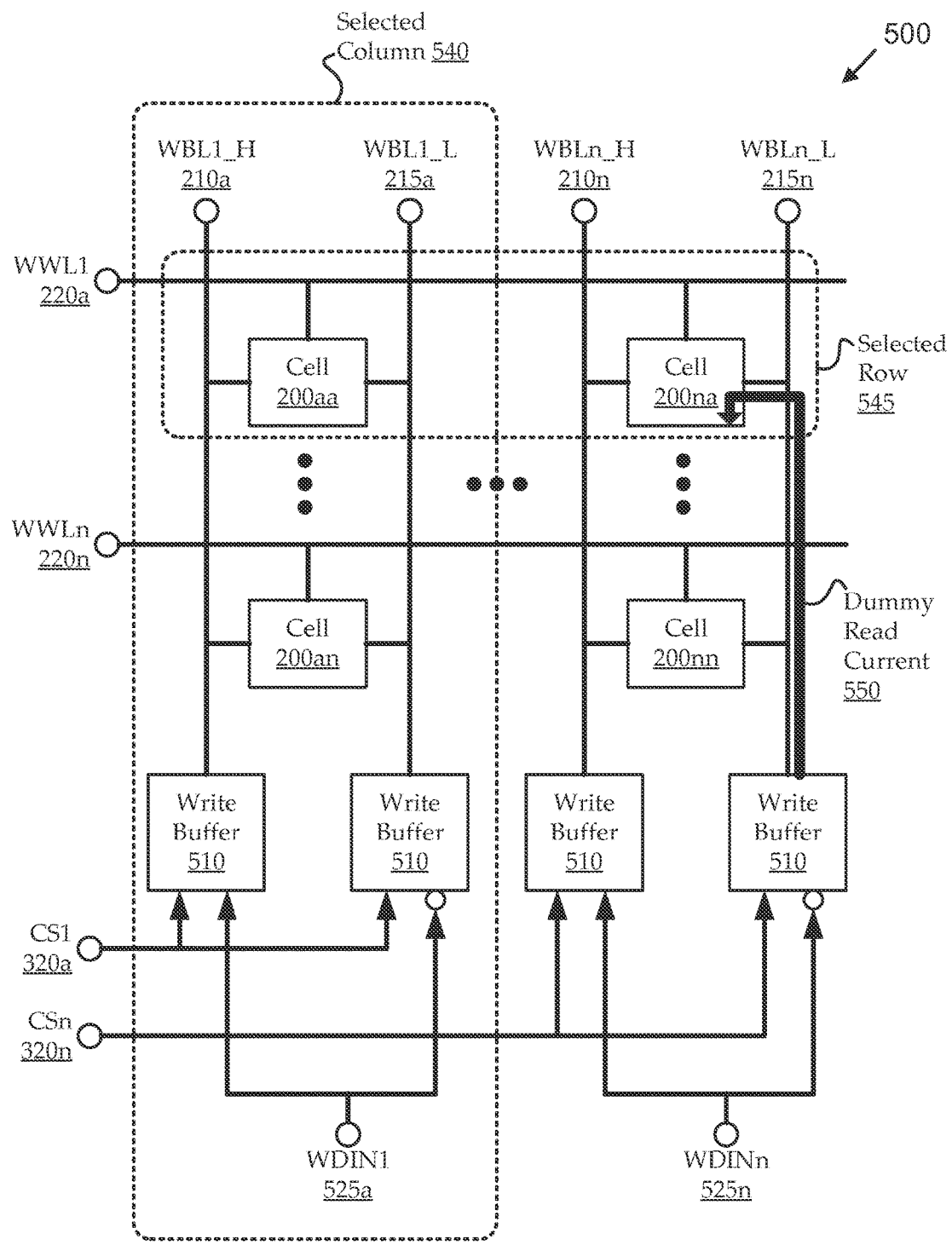
FIG. 5 shows an illustrative partial memory array having a number of conventional bitcells.

Another such undesirable feature is that, in some conventional implementations, adding column select logic 310 can appreciably increase power consumption of the memory circuit. For the sake of illustration, FIG. 5 shows an illustrative partial memory array 500 having a number of conventional bitcells 200. As shown, each column of bitcells 200 can include one or more write buffers 510 for supporting write operations, and the write buffers 510 can be selected according to column select signals 320. An additional signal (shown as WDIN 525) can define what value is being written to a selected bitcell 200 via the write bitlines 210,215. The illustrated scenario assumes that WWL1 220a and CS1 320 are used to select a particular row 545 and column 540 corresponding to a particular one of the bitcells 200aa in the array 500. While the column selection can be effective, the conventional technique causes unnecessary current (dummy current) to be consumed by the unselected columns of the selected rows 545 (e.g., in bitcell 200na), as indicated by dummy read current 550. This dummy read current 550 can come from the write buffers 510 of the unselected columns. For example, if CS 320 is an 8-bit selection signal, one-eighth of the signal is used for writing to a bitcell 200, while the other seven-eighths is effectively wasted power. As the array 500 becomes wider (i.e., more bits of column selection), the wasted power becomes even more significant.

Figure 4:
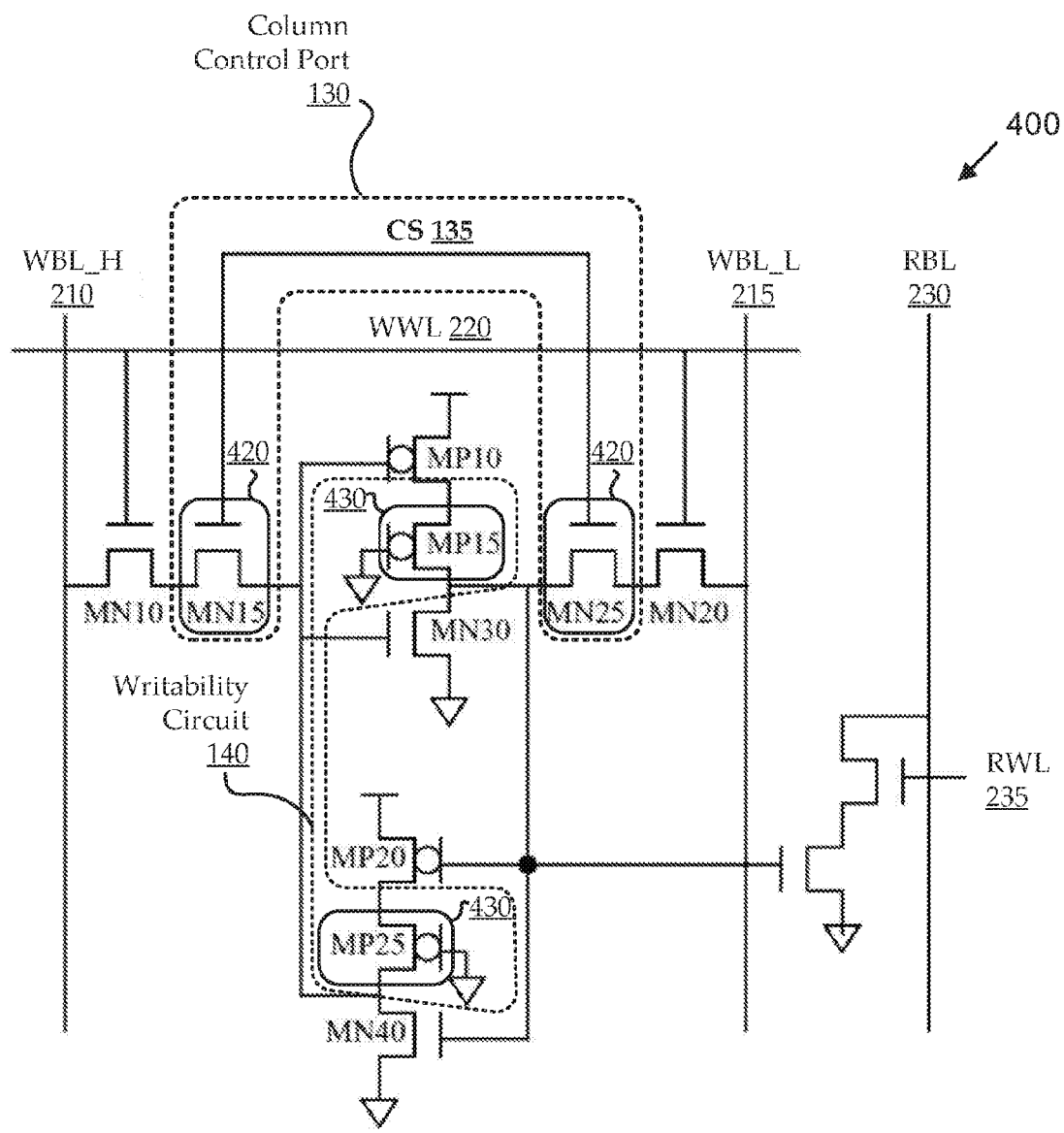
FIG. 4 shows a novel bitcell, according to various embodiments.

FIG. 4 shows a novel bitcell 400, according to various embodiments. The novel bitcell 400 can include write and read sub-circuits similar to those described with reference to the conventional bitcell 200 of FIGS. 2 and 3. However, the novel bitcell 400 further includes a column control port circuit 130 and a writability circuit 140. The column control port circuit 130 adds series pass gates 420 to the write select paths of the write sub-circuit. For example, as illustrated, each series pass gate 420 can be implemented as an NMOS transistor, or the like. The series pass gates 420 can be coupled to a common column select signal 135.

The series pass gates 420 can be implemented in any suitable manner for adding the column select signaling 135 to the write select path. For example, the write sub-circuit includes a pair of cross-coupled inverters, coupled between two write bitlines (i.e., a high write bitline (WBL_H) 210 and a low write bitline (WBL_L) 215) via write select gates (e.g., shown as NMOS transistors MN10 and MN20). The gates of the write select gates are controlled by a write wordline (WWL) 220, so that data to be written is defined by the values of the write bitlines 210,215, and asserting WWL 220 (or de-asserting, depending on the implementation) causes the data to be passed and latched to the cross-coupled inverters (i.e., as described with reference to the 6T core configuration of FIG. 2). The series pass gates 420 provide additional gating between the write bitlines 210,215 and the cross-coupled inverters. In the illustrated configuration, the series pass gates 420 are coupled between the cross-coupled inverters and each write select gate. In other configurations, the series pass gates 420 are coupled between each write select gate and its respective write bitline 210,215. In those or other configurations, selecting the bitcell 400 involves asserting (or de-asserting, depending on the implementation) both WWL 220 and the column select signal 135. Accordingly, such a configuration includes the two write select gates, the latching circuit, and the series pass gates 420, which can be an eight-transistor ("8T") core.

While the column control port circuit 130 provides certain features, it can also negatively impact writability (and/or readability). For example, certain charge sharing effects of the added series pass gates 420 can reduce writability and/or read noise margin of the bitcell 400. Some embodiments include a writability circuit 140 to address these impacts. Embodiments of the writability circuit 140 include one or more ground-connected gates added to the latch circuit. In some implementations, the latch circuit is a pair of cross-coupled inverters, and each side of the cross-coupled inverter includes a PMOS transistor and an NMOS transistor that form a series path between a HIGH voltage level and ground (e.g., or any suitable LOW voltage level). Some implementations of the writability circuit 140 add a ground-connected PMOS transistor 430 between the PMOS and NMOS transistors of each side of the cross-coupled inverter. For example, the ground-connected PMOS transistors 430 can add stability to the latching, which can improve writability and/or readability.

The novel bitcell 400 configuration of FIG. 4 can provide improved performance over conventional column selection approaches. For example, while larger than the conventional bitcell 200 of FIG. 2 without any column selection, the column selection of FIG. 4 can add approximately half the area as compared to the area added by the conventional approach of FIG. 3 (e.g., FIG. 2 (no column selection) can be approximately 0.237 $\mu m^2$, FIG. 3 (conventional column selection) can be approximately 0.528 $\mu m^2$, and FIG. 4 (novel column selection) can be approximately 0.355 $\mu m^2$).

Figure 6:
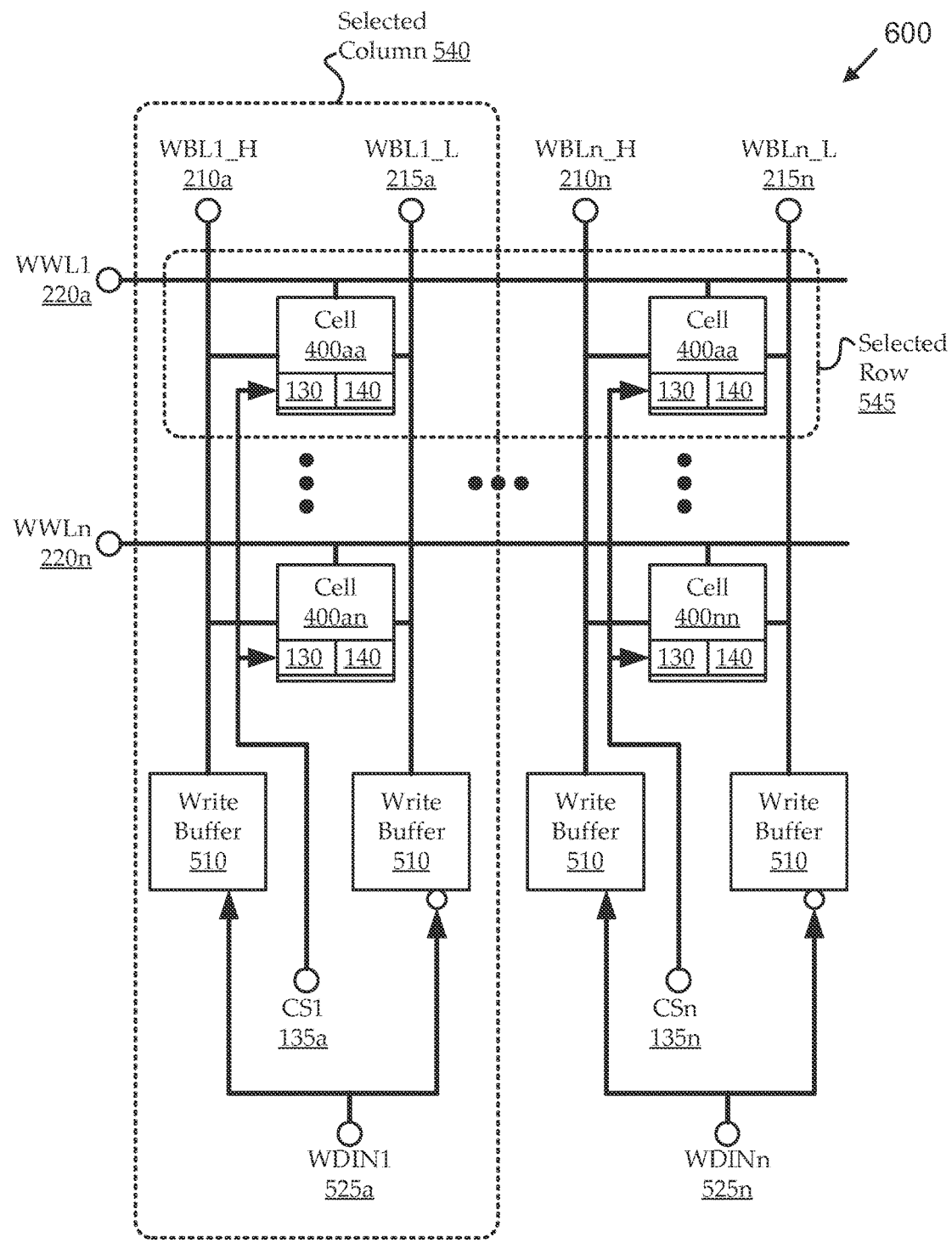
FIG. 6 shows an illustrative partial memory array having a number of novel bitcells.

Further, the novel bitcell 400 can avoid the dummy read current 550 concerns described with reference to FIG. 5. For example, FIG. 6 shows an illustrative partial memory array 600 having a number of novel bitcells 400. As shown, each bitcell 400 has a column control port circuit 130, and each column has its own column select signal 135. As in FIG. 5, each column of bitcells 400 can include one or more write buffers 510 for supporting write operations, and the write buffers 510 receive data defined by WDIN 525 for writing to a selected bitcell 400 via respective write bitlines 210, 215. The illustrated scenario assumes that WWL1 220a and CS1 320 are used to select a particular row 545 and column 540 corresponding to a particular one of the bitcells 400aa in the array 600. Notably, such an approach avoids unnecessary current (dummy current) being consumed by the unselected columns of the selected rows 545 (e.g., bitcell 400na). As described above, avoiding such dummy current consumption can yield appreciable power savings, particularly as the array 600 becomes wider. As an example, the array 600 of FIG. 6 can consume approximately 45-percent of that of the array 500 of FIG. 5 during write mode operation (e.g., 10.1 mW, as compared to 17.8 mW).

As described above, the addition of series pass gates 420 for column selection can add area to the bitcell 400 (though not as much as conventional approaches). Further, the series pass gates 420 can, in some implementations, increase column select loads. For example, implementing a large column can involve coupling a large number of series pass gates 420 to each column select line (e.g., column select signal 135). Further, ensuring read and write functionality of the bitcell 400 can dictate an optimum (e.g., or a minimum) size for the transistors used in the series path (e.g., the series pass gates 420 and the write-select gates). Accordingly, the two gates in series on each side of the latching circuit can effectively increase (e.g., double) the effective gate size on each side of the latching circuit to ensure sufficient (e.g., the same) current for read/write operations. Thus, more area can manifest as more load on the column select signals 135. FIGS. 7-10 show various techniques for addressing the added area and column select load that can arise from incorporating column control port circuits 130 into bitcells.

Figure 7:
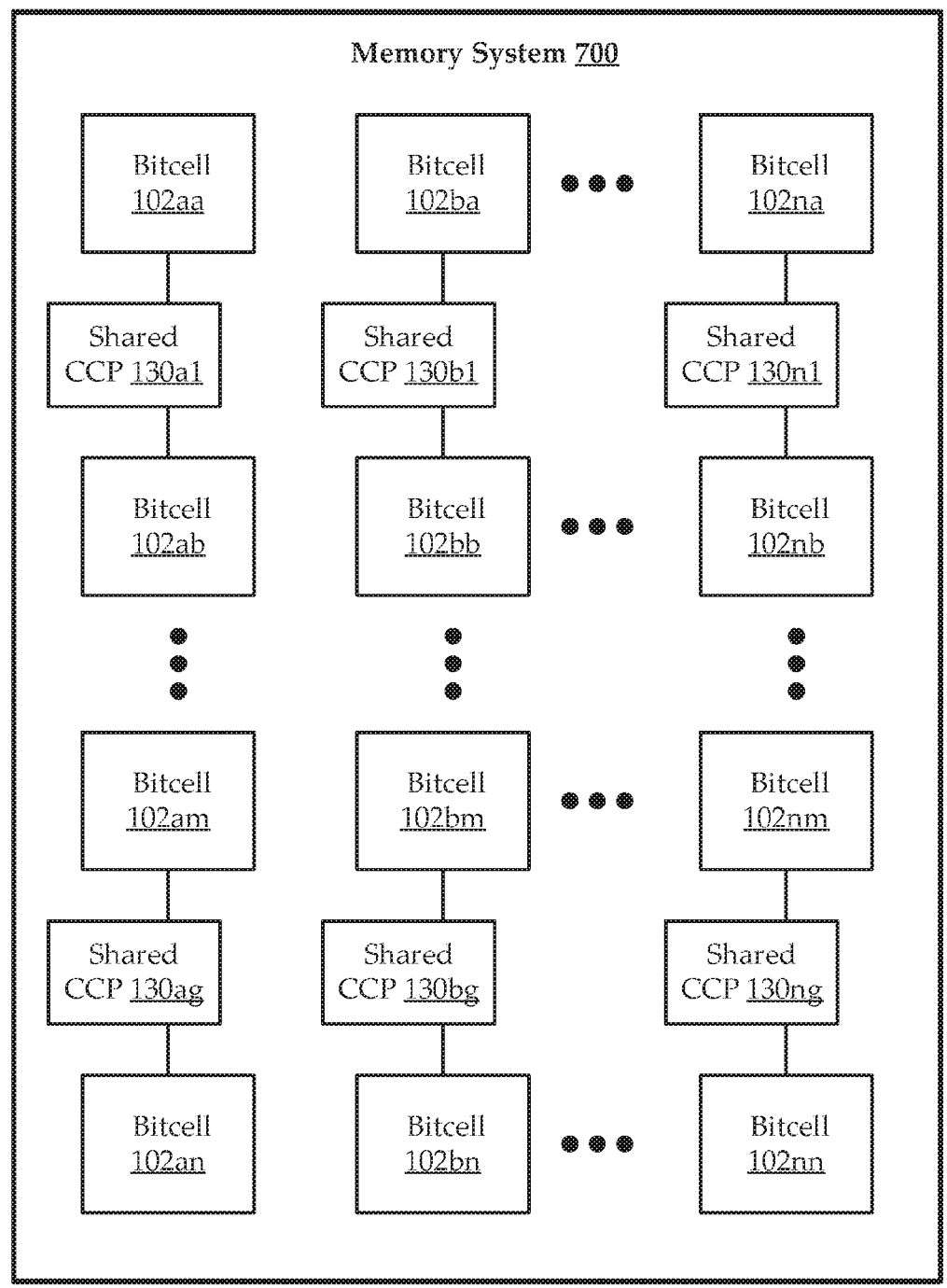
FIG. 7 shows a simplified embodiment of a memory array that includes a number of bitcells configured to share column control port circuits, according to various embodiments.

FIG. 7 shows a simplified embodiment of a memory array 700 that includes a number of bitcells 102 configured to share column control port circuits 130, according to various embodiments. Though each column control port circuit 130 is shown as shared between a pair of adjacent bitcells 102, other implementations can share column control port circuits 130 between larger numbers of bitcells 102 and/or in different ways (however, more sharing can involve use of larger transistors, which can undesirably increase resistance). By sharing column control port circuits 130, the added area can be spread across adjacent bitcells 102, thereby reducing the overall area impact. Further, sharing column control port circuits 130 can result in fewer gates being added to the column select signals 135. Accordingly, the column select signals 135 can see a reduced cascade load, which can reduce the column select load and can increase read and/or write speeds.

Figure 8:
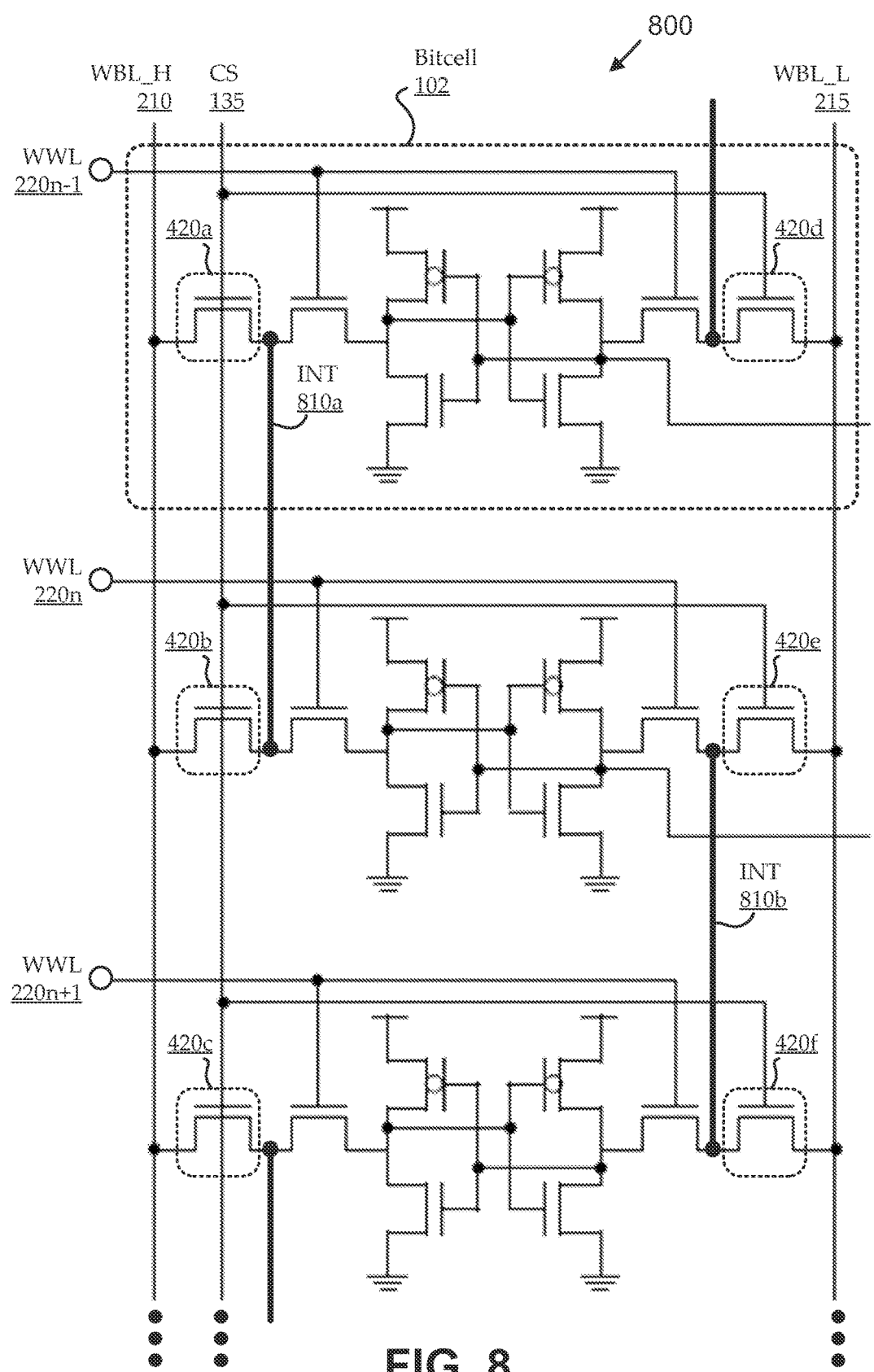
FIG. 8 shows one illustrative configuration for sharing column control port circuits.

FIG. 8 shows one illustrative configuration 800 for sharing column control port circuits 130. The configuration includes a number of bitcells 102. Each bitcell 102 is shown as an 8T configuration, such as the configuration described with reference to FIG. 4. Though not shown, other embodiments can include a read sub-circuit, a writability circuit, etc. Notably, each bitcell 102 is coupled with a column select line 135 via one or more series pass gates 420 to form shared column select ports. As illustrated, a series pass circuit includes series pass gates 420a, 420b, both coupled between a shared intermediate node 810a and a write bitline (WBL_H 210). The shared intermediate node 810a is shown coupling a first column select node of a first memory bitcell and a first column select node of a second memory bitcell. Another series pass circuit is partially shown as include series pass gate 420c coupled between another shared intermediate node and the write bitline (WBL_H 210), which would be shared between a third memory bitcell and a next bitcell in the column (not shown).

Because each shared column control port circuit 130 includes a series pass gate 420 that is connected in parallel and asserted along with the series pass gate 420 of another shared column control port circuit 130, each series pass gate 420 can be smaller (e.g., half the size) as compared to that of a non-shared configuration. Some embodiments can include a staggered configuration. For example, as illustrated, another series pass circuit includes series pass gates 420e, 420f, both coupled between a shared intermediate node 810b and a write bitline (WBL_L 215). The shared intermediate node 810b is shown coupling a second column select node of the second memory bitcell and a second column select node of the third memory bitcell. In the illustrated configuration, shared intermediate node 810a and shared intermediate node 810b are complementary, as one is coupled with WBL_H 210 and the other is coupled with WBL_L 215.

Figure 9:
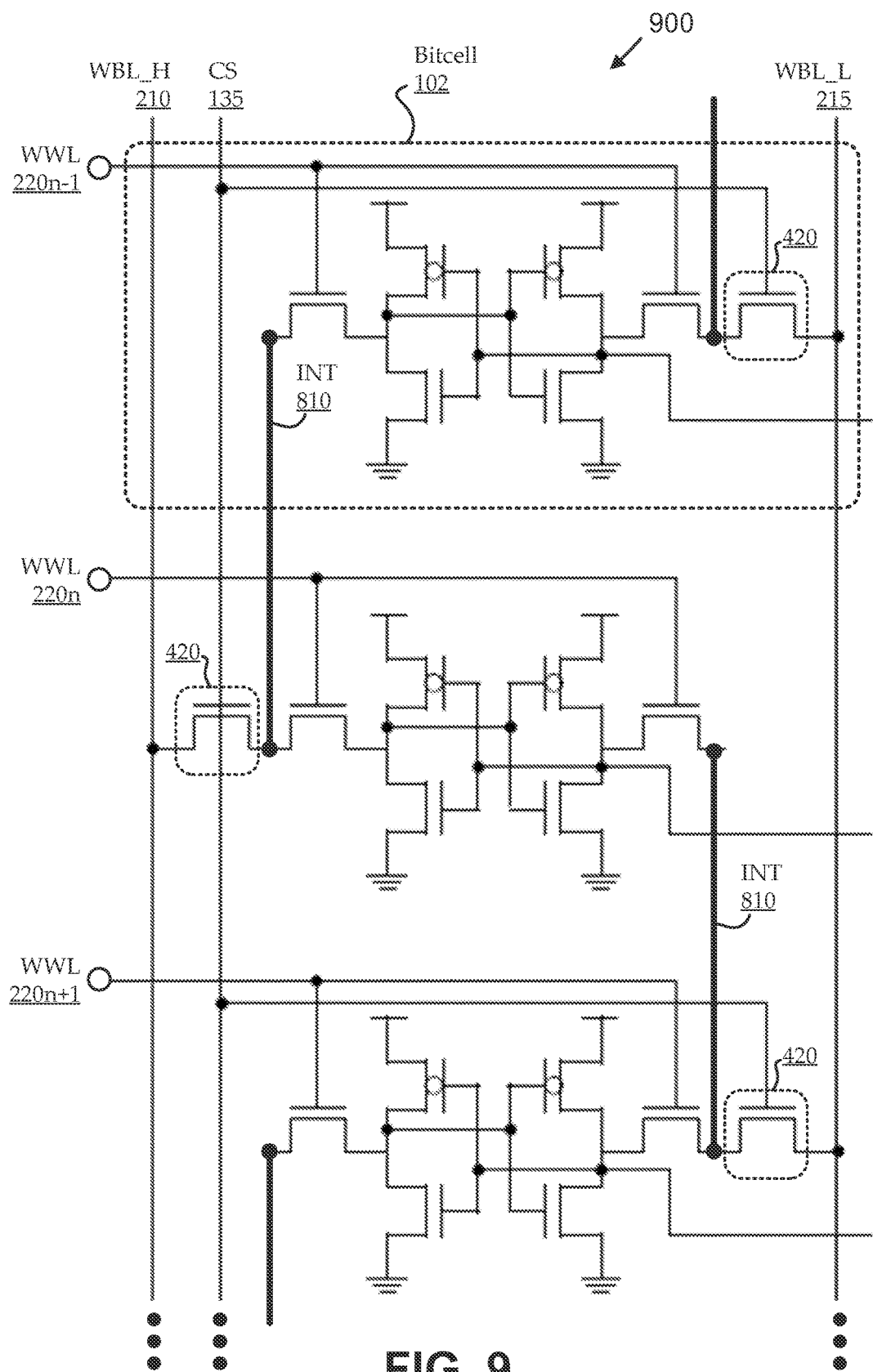
FIG. 9 shows another illustrative configuration for sharing column control port circuits.

FIG. 9 shows another illustrative configuration 900 for sharing column control port circuits 130. The configuration is similar to the one described with reference to FIG. 8, except that it includes a different series pass circuit implementation. In particular, while FIG. 8 implements each series pass circuit with a pair of series pass gates 420 (e.g., each being half the size of a non-shared implementation), FIG. 9 implements the series pass circuits each with a single shared series pass gate 420 (e.g., comparable to the size used in the non-shared implementation). Each bitcell 102 has a series pass gate 420 only on one side (i.e., coupled to either WBL_H 210 or WBL_L 215, but not both), and the other side shares the series pass gate of its neighboring bitcell 102. For example, as illustrated, the series pass gates 420 are staggered.

Figure 10:
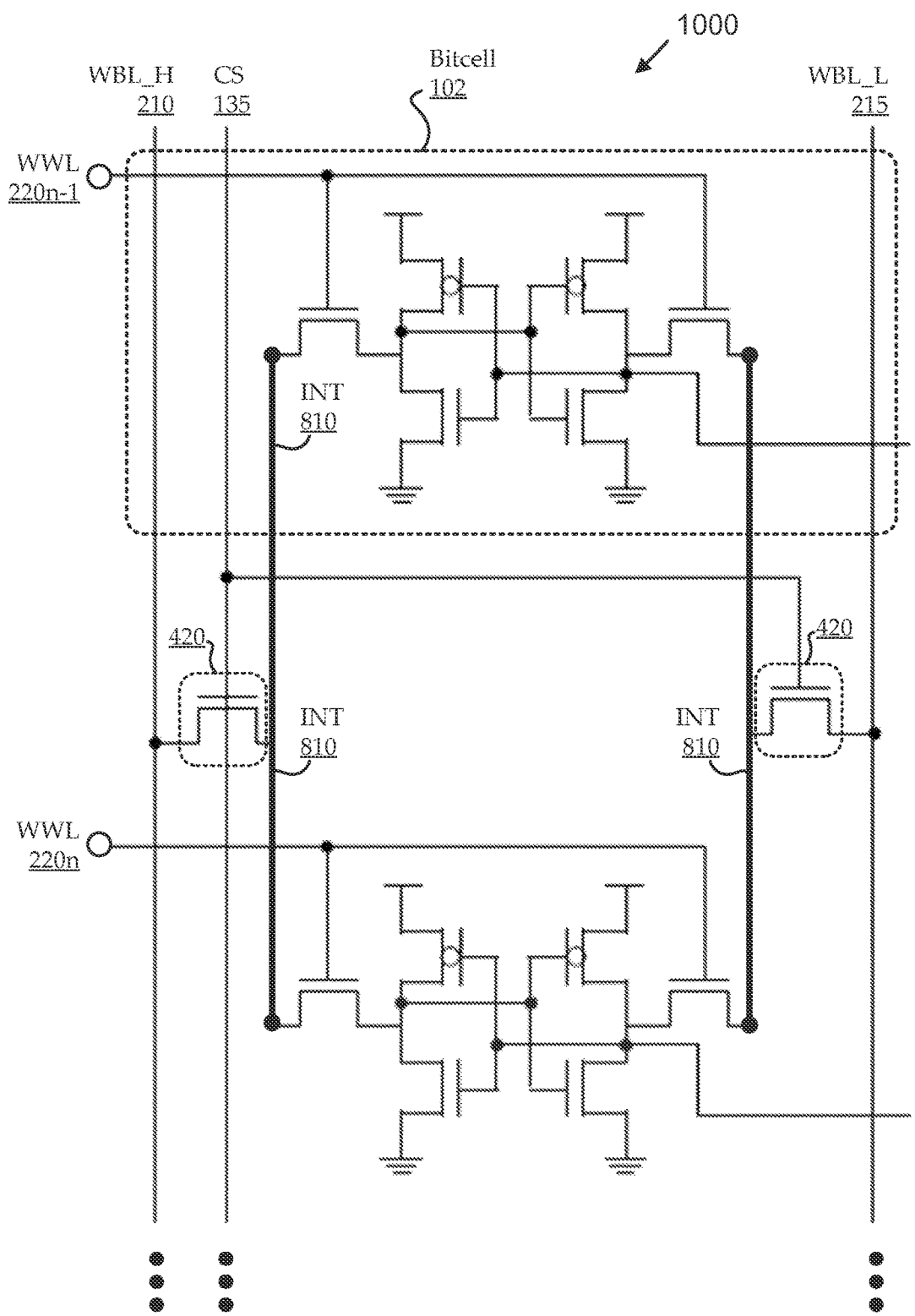
FIG. 10 shows another illustrative configuration for sharing column control port circuits.

FIG. 10 shows another illustrative configuration 1000 for sharing column control port circuits 130. The configuration is similar to the ones described with reference to FIGS. 8 and 9, except that it includes a different series pass circuit implementation. In particular, while each bitcell 102 of FIG. 8 includes two series pass gates 420 (i.e., such that each series pass circuit includes a pair of series pass gates 420), and each bitcell 102 of FIG. 9 includes a single series pass gate 420 (i.e., such that each series pass circuits includes a staggered shared series pass gate 420, each bitcell 102 of FIG. 10 shares series pass gates 420 on both of its sides. As illustrated, bitcells 102 can be implemented in pairs, where one side of the pair of bitcells 102 is coupled to WBL_H 210 via a first shared series pass gate 420, and the other side of the pair of bitcells 102 is coupled to WBL_L 215 via a second series pass gate 420 (e.g., via respective shared intermediate nodes). In some implementations, more than two bitcells 102 can share series pass gates 420. However, such implementations can involve larger transistors, which can yield larger resistances, which can be undesirable in some applications.

Figure 11:
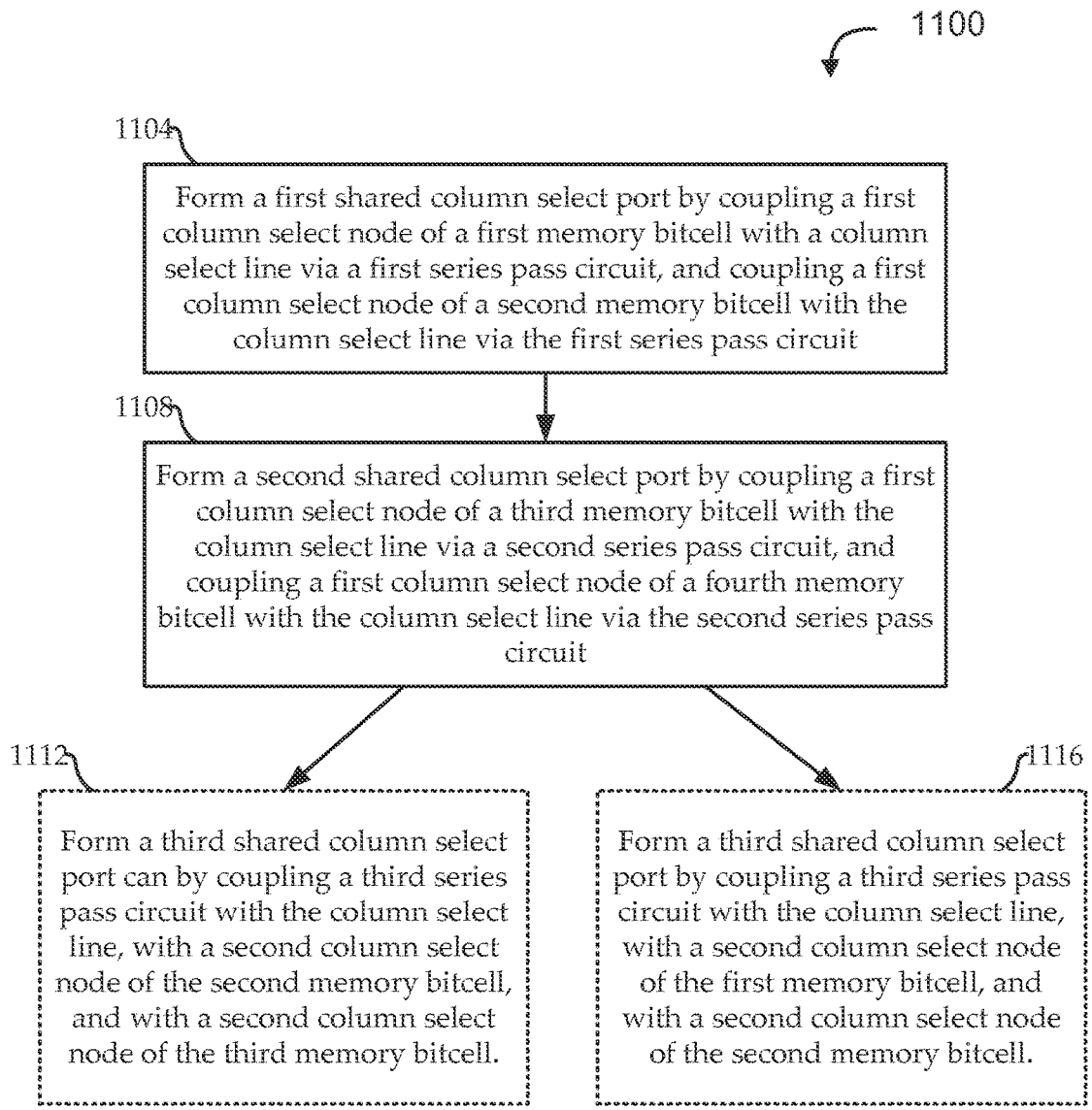
FIG. 11 shows a flow diagram of an illustrative method for providing column select functionality, according to various embodiments.

FIG. 11 shows a flow diagram of an illustrative method 1100 for providing column select functionality, according to various embodiments. Embodiments begin at stage 1104 by forming a first shared column select port by coupling a first column select node of a first memory bitcell with a column select line via a first series pass circuit, and coupling a first column select node of a second memory bitcell with the column select line via the first series pass circuit. At stage 1108, embodiments can form a second shared column select port by coupling a first column select node of a third memory bitcell with the column select line via a second series pass circuit, and coupling a first column select node of a fourth memory bitcell with the column select line via the second series pass circuit.

In some embodiments, forming the first shared column select port at stage 1104 can include coupling a first terminal of a first series pass gate to the column select line, coupling a second terminal of the first series pass gate to the first column select node of the first memory bitcell, coupling a third terminal of a second series pass gate to the column select line, coupling a fourth terminal of the second series pass gate to the first column select node of the second memory bitcell, and coupling the second terminal to the fourth terminal. An example of such a configuration is shown in FIG. 8. In other embodiments, forming the first shared column select port at stage 1104 can include coupling a first terminal of a single series pass gate to the column select line, and coupling a second terminal of the single series pass gate to the first column select node of the first memory bitcell and to the first column select node of the second memory bitcell. An example of such a configuration is shown in FIGS. 9 and 10.

In some embodiments, at stage 1112, a third shared column select port can be formed by coupling a third series pass circuit with the column select line, with a second column select node of the second memory bitcell, and with a second column select node of the third memory bitcell. An example of such a configuration is shown in FIGS. 8 and 9. In other embodiments, at stage 1116, a third shared column select port can be formed by coupling a third series pass circuit with the column select line, with a second column select node of the first memory bitcell, and with a second column select node of the second memory bitcell (e.g., and/or similarly with more than two memory bitcells). An example of such a configuration is shown in FIG. 10.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The various operations of methods and functions of certain system components described above may be performed by any suitable means capable of performing the corresponding functions. The means may include various hardware and/or software component(s) and/or module(s), including, but not limited to a circuit, an application specific integrated circuit (ASIC), or processor. For example, logical blocks, modules, and circuits described may be implemented or performed with a general purpose processor, a digital signal processor (DSP), an ASIC, a field programmable gate array signal (FPGA) or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm, or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A memory circuit comprising:
    a plurality of memory bitcells connected in parallel with each other between a high write bitline and a low write bitline;
    a plurality of adjacent memory bitcells connected in parallel with each other between the high write bitline and the low write bitline;
    a first shared column control port circuit coupling each memory bitcell of the plurality of memory bitcells to each of the plurality of adjacent memory bitcells, wherein the first shared column control port circuit includes a first series pass gate in each of said plurality of memory bitcells and a first series pass gate in each of said adjacent memory bitcells, wherein a first terminal of the first series pass gate of each of the plurality of memory bitcells is coupled to a first terminal of the first series pass gate of each of the plurality of adjacent memory bitcells via the high write bitline, wherein a second terminal of the first series pass gate of each of the plurality of memory bitcells is directly coupled via a first shared intermediate node to a second terminal of the first series pass gate of a first respective one of the plurality of adjacent memory bitcells; and
    a second shared column control port circuit coupling each memory bitcell of the plurality of memory bitcells to each of the plurality of adjacent memory bitcells, wherein the second shared column control port circuit includes a second series pass gate in each of said plurality of memory bitcells and a second series pass gate in each of said adjacent memory bitcells, wherein a first terminal of the second series pass gate of each of the plurality of memory bitcells is coupled to a first terminal of the second series pass gate of each of the plurality of adjacent memory bitcells via the low write bitline, wherein a second terminal of the second series pass gate of each of the plurality of memory bitcells is directly coupled via a second shared intermediate node to a second terminal of the second series pass gate of a second respective one of the plurality of adjacent memory bitcells, different from the first respective one of the plurality of adjacent memory bitcells, wherein a column select line directly interconnects the first and second shared column control port circuits.

2. The memory circuit of claim 1, wherein each of said plurality of memory bitcells and each of said adjacent plurality of memory bitcells comprises:
    a write sub-circuit having a cross-coupled inverter sub-circuit coupled with the first series pass gate.

3. The memory circuit of claim 2, wherein the cross-coupled inverter sub-circuit is coupled with a ground-coupled writability gate.

4. The memory circuit of claim 3, wherein:
    the ground-coupled writability gate is a first PMOS transistor;
    the cross-coupled inverter sub-circuit comprises two transistor networks, each comprising a second PMOS transistor, an NMOS transistor, and the ground-coupled writability gate;
    the second PMOS transistor is coupled between a logic high voltage level and a first terminal of the ground-coupled writability gate;
    the NMOS transistor is coupled between a ground voltage level and a second terminal of the ground-coupled writability gate; and
    a gate terminal of the ground-coupled writability gate is coupled to the ground voltage level.

5. The memory circuit of claim 2, wherein each of said plurality of memory bitcells and each of said adjacent plurality of memory bitcells further comprises a read sub-circuit.

6. A method comprising:
    forming a first shared column select port circuit by:
        coupling a first terminal of a first series pass gate of a first one of a plurality of memory bitcells to a first terminal of a first series pass gate of a first respective one of a plurality of adjacent memory bitcells via a high write bitline, wherein the high write bitline connects each of the plurality of memory bitcells to each of the plurality of adjacent memory bitcells such that each of plurality of memory bitcells is connected in parallel with each other between the high write bitline and a low write bitline, and each of the plurality of adjacent memory bitcells is connected in parallel with each other between the high write bitline and the low write bitline; and
        directly coupling a second terminal of the first series pass gate of the first one of the plurality of memory bitcells to a second terminal of the first series pass gate of the first respective one of the plurality of adjacent memory bitcells via a first shared intermediate node;
    and
    forming a second shared column select port circuit by:
        coupling a first terminal of a second series pass gate of the first one of the plurality of memory bitcells to a first terminal of a second series pass gate of a second respective one of the plurality of adjacent memory bitcells, different from the first respective one of the plurality of adjacent memory bitcells, via the low write bitline;

directly coupling a second terminal of the second series pass gate of the first one of the plurality of memory bitcells to a second terminal of the second series pass gate of the second respective one of the adjacent plurality of memory bitcells via a second shared intermediate node, wherein a column select line directly couples the first series pass gates of the plurality of memory bitcells and the plurality of adjacent memory bitcells to the second series pass gates of the plurality of memory bitcells and the plurality of adjacent memory bitcells.

7. The method of claim 6, further comprising:
coupling a cross-coupled inverter sub-circuit of a write sub-circuit with the first series pass gate.

8. The method of claim 7, further comprising:
coupling the cross-coupled inverter sub-circuit with a ground-coupled writability gate.

9. The method of claim 7, wherein:
the cross-coupled inverter sub-circuit comprises two transistor networks, each comprising a first PMOS transistor, a second PMOS transistor, and an NMOS transistor; and coupling the cross-coupled inverter sub-circuit with the first series pass gate comprises:

coupling the second PMOS transistor between a logic high voltage level and a first terminal of the first PMOS transistor;

coupling the NMOS transistor between a ground voltage level and a second terminal of the first PMOS transistor; and coupling a gate terminal of the first PMOS transistor to the ground voltage level.

10. The method of claim 7, further comprising:
coupling a read sub-circuit to the write sub-circuit.

* * * * *

UNITED STATES PATENT AND TRADEMARK OFFICE
CERTIFICATE OF CORRECTION

PATENT NO. : 10,008,257 B2
APPLICATION NO. : 14/948028
DATED : June 26, 2018
INVENTOR(S) : Kwack et al.

It is certified that error appears in the above-identified patent and that said Letters Patent is hereby corrected as shown below:

On the Title Page

[*], Notice, Line 3, after "0 days." delete "days.".

In the Specification

Column 3, Line 45, delete "six-transistor)" and insert -- six-transistor --, therefor.

Column 3, Line 52, delete "WBL_H." and insert -- WBL_H --, therefor.

Signed and Sealed this
Second Day of April, 2019

Andrei Iancu
*Director of the United States Patent and Trademark Office*